United States Patent [19]

del Rio

[11] 4,405,864

[45] Sep. 20, 1983

[54] ION IMPLANTER END PROCESSING STATION

[75] Inventor: Eddy H. del Rio, Jupiter, Fla.

[73] Assignee: RCA Corporation, New York, N.Y.

[21] Appl. No.: 300,118

[22] Filed: Sep. 8, 1981

[51] Int. Cl.³ .......................... G21K 5/08; G21K 5/10; H01J 37/18; H01J 37/20
[52] U.S. Cl. ............................... 250/441.1; 250/442.1; 250/492.2
[58] Field of Search ............... 250/440.1, 441.1, 492.2, 250/491, 442.1

[56] References Cited

U.S. PATENT DOCUMENTS

| 4,033,904 | 7/1977 | Gerlach et al. | 250/440.1 |
| 4,035,655 | 7/1977 | Guernet et al. | 250/492.2 |
| 4,044,266 | 8/1977 | Jespersen et al. | 250/441.1 |

Primary Examiner—Alfred E. Smith
Assistant Examiner—Jack I. Berman
Attorney, Agent, or Firm—Birgit E. Morris; Donald S. Cohen; Lawrence P. Benjamin

[57] ABSTRACT

A novel end processing station having a carousel chamber that closely follows the configuration of the carousel to reduce the volume within the chamber to be pumped down.

4 Claims, 2 Drawing Figures

ION IMPLANTER END PROCESSING STATION

BACKGROUND OF THE INVENTION

This invention relates, in general, to ion implantation systems and, more particularly, to an improved ion implanter end processing station.

The usual ion implantation facility consists of a source of ions, an accelerator and an end processing station. In the device there are two basic ion sources available for use, one source utilizes a 100 MHZ 200 watt oscillator to drive a plasma in a pyrex tube filled with a gas which contains the desired atomic species. Gas is fed into the plasma tube, accelerated and then formed into a beam before it is caused to impinge on the device to be implanted with the transported atomic species. The system is maintained under a vacuum by means of diffusion pumps for the source/accelerator section, the drift tube section and the target or end chamber. To maintain a vacuum in each area, one gate valve is placed in the drift tube down stream of the accelerator and one valve placed upstream of the target chamber. The target chamber is provided with a pump. The accelerated beam containing the ion species (which species represents the common dopant atom) is caused to impinge on the wafers to be implanted, that are contained in the end chamber.

In one embodiment the wafers are usually mounted on a carousel and arranged around the periphery thereof while the carousel is caused to rotate. As the carousel rotates, the beam is deflected and thus caused to scan across each wafer. After a predetermined time, which will dictate the amount of dopant atoms implanted into each wafer, the gate valve between the drift tube and the end chamber is closed to seal the end chamber from the remainder of the implantation system and the end chamber is exhausted to the atmosphere. The carousel is then removed and replaced with another carousel having wafers arranged around the periphery thereof.

It has long been recognized by the art that in order to increase production of implanted wafers that if a pair of carousels were placed in the chamber, a greater number of wafers can be implanted during the same pumped down and exhaust cycle. The prior art now provides a pair of back-to-back carousels, each containing about twenty 4" wafers, arranged on each carousel, and means to shift the position of each carousel into the path of the accelerated beam. With such an arrangement, it would take about 15 minutes to pump the end chamber down to the required vacuum, about 4 minutes to process each carousel and about 4 minutes to exhaust the chamber. Thus, about 40 wafers could be processed in about 27 minutes. It should be understood, however, that if the wafers were smaller, i.e., 2" wafers, a greater number of wafers could be processed but the system would still be limited to a 15 minute pump down time, an 8 minute implantation time and a 4 minute exhaust time and would still, thus, require a 27 minute cycle. The 15 minute pump down time is required because of the large volume required when two carousels are mounted back-to-back. In this arrangement, the wafers on a first carousel, for example the upper carousel, are first processed then both carousels are moved vertically so that the wafers in the upper carousel are out of the view of the incoming beam while the wafers on the lower carousel are now in the place previously occupied by the upper carousel. The wafers on the lower carousel are then processed. The resultant chamber necessary to accommodate these carousels thus dictates the need for the inordinately long pump down time and the accompanying long exhaust time.

SUMMARY OF THE INVENTION

A novel end processing chamber is described wherein the chamber closely follows the configuration of a carousel to markedly reduce the volume within the chamber to be pumped down and subsequently exhausted. Further, the entire chamber is made to be arranged at an angle with respect to the incoming beam and is thus more easily adjustable about the traditional 7° offset required by the prior art.

DETAILED DESCRIPTION OF THE INVENTION

Figure 1:
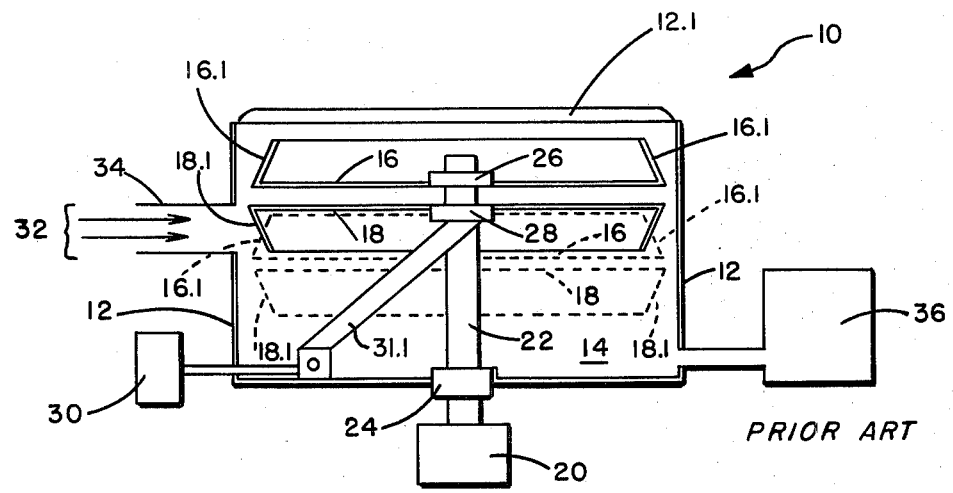
FIG. 1 is a cross-sectional schematic representation of the prior art end processing chamber.

Referring now to FIG. 1, there is shown a cross-sectional schematic representation of a typical processing system 10 currently being used by the prior art. The processing system consists of housing 12, which defines chamber 14, and is provided with a hinged lid 12.1 and gaskets (not shown) to provide a good vacuum seal as is well known in the art. Within chamber 14 are carousels 16 and 18 fixedly mounted on shaft 22 by securing means 26 and 28, respectively. Shaft 22 is provided with a vacuum journal 24 and is rotated at about 100 revolutions/min (r.p.m.) by means of motor 20. Arranged around the periphery of carousel 16 are individually mounted holding means 16.1 for holding the wafers to be implanted. Similarly, arranged around the outer periphery of carousel 18 are individually mounted holding means 18.1 for holding the wafers to be implanted.

In this figure, wafers mounted around the periphery of carousel 18 are being processed first. As shown, the beam 32, which has been accelerated and focused, enters chamber 14 by means of tube 34 to impinge on the wafers mounted on the peripheral holding members 18.1. Depending upon the dose required, the beam is caused to scan in a direction perpendicular to the rotation of carousel 18. When the desired dosage is reached, the beam is turned off and the carousel assembly is lowered to the position shown in dotted outline. At this point the wafers mounted in holding means 16.1 are now being exposed to beam 32 while the wafers in holding means 18.1 are removed from view. The carousels are raised and lowered by means of motor 30 and arm 31.1. To complete the device, there is shown a vacuum pump 36, communicating with chamber 14, in order to evacuate chamber 14 and to maintain the system under reduced pressure during the implanting procedure.

Thus, as previously stated, to perform one cycle, wafers are mounted around the periphery of carousels 16 and 18, which carousels are then mounted in chamber 14 of processing system 10. The lid 12.1 is closed and chamber 14 is evacuated by means of diffusion pump 36. When chamber 14 has reached a vacuum of about $5 \times 10^{-6}$ torr, the carousels are rotated at a speed of about 100 r.p.m. and a gate valve (not shown) is opened upstream of the processing chamber to allow the implanting ions, as designated by arrows 32, to enter chamber 14 via tube 34 and impinge on the mounted wafers on carousel 18. When the processing has been completed for the wafers mounted on carousel 18, motor 30 and the associated arm 31.1 causes both carousels to move in a downward direction to assume the position as indicated by the dotted lines and to place carousel 16 in a position for the wafers arranged around its periphery to be exposed to beam 32. Upon the completion of the implanting of the wafers mounted on carousel 16, a gate valve upstream of tube 34 is closed to seal chamber 14 from the remainder of the system and chamber 14 is then vented to the atmosphere. Thereafter, lid 12.1 is opened, the processed wafers removed and chamber 14 is reloaded so that additional wafers may be processed.

In the prior art process above described, a typical chamber 14 may have internal dimensions of about 22 inches in diameter and about 11.25 inches deep and have a volume of about 4,276 cubic inches (in$^3$) and carousels 16 and 18 would each displace about 106 in$^3$. Thus, the total volume to be pumped down by diffusion pump 36 is about 4,064 in$^3$ [4276 − (2 × 106). Since the ratio of the volume of the chamber to be evacuated (4,064 in$^3$) to the volume displaced by the carousels (212 in$^3$) is so high, i.e. 20:1, the prior art process requires about 15 minutes to pump chamber 14 down to about $5 \times 10^{-6}$ torr. Then, upon completion of an 8 minute processing time (4 minutes per carousel), about 4 minutes is required to vent in order to prevent condensation of the incoming air on the inner walls of housing 12.

Figure 2:
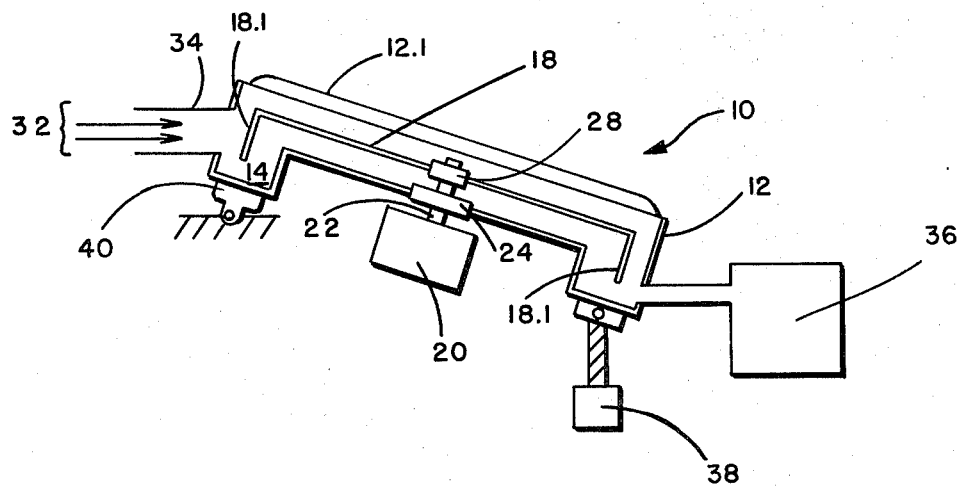
FIG. 2 is a cross-sectional schematic representation of the end chamber of the subject invention.

Referring now to FIG. 2, it should be noted that similar elements will be similarly numbered. In this figure, there is shown a cross-sectional schematic representation of my novel end chamber processing system 10 wherein housing 12 is provided with a hinged lid 12.1 and gaskets (not shown) to provide a good vacuum seal. However, as distinguished from the prior art, housing 12 is designed to closely follow the contour of carousel 18. Carousel 18 is fixedly mounted to shaft 22 by securing means 28 and shaft 22 is further provided with a vacuum journal 24 in order that the rotational movement provided by motor 20 may be imparted to carousel 18 while maintaining a vacuum. As in the prior art, carousel 18 is rotated at about 100 r.p.m.

As in the prior art, wafers to be processed are mounted around the periphery of carousel 18 on holding members 18.1 and, as carousel 18 rotates, the individual wafers are exposed to beam 32 which has been accelerated and focused and which enters the chamber 14 by means of tube 34. Depending upon the dose required, the beam is caused to scan in a direction perpendicular to the rotation of carousel 18 and, when the desired dosage is achieved, the beam is turned off and the carousel rotation is terminated.

Thus, to perform one cycle, wafers are mounted around the periphery of carousel 18 and held thereon by holding means 18.1 and the carousel is then mounted in chamber 14. Lid 12.1 is closed and chamber 14 is evacuated by means of diffusion pump 36. When chamber 14 has reached a vacuum of about $5 \times 10^{-6}$ torr, carousel 18 is rotated at a speed of about 100 r.p.m. and a gate valve (not shown) is opened upstream of the processing chamber to allow the implanting ions, as designated by arrows 32, to enter chamber 14 via tube 34 and impinge on the wafers mounted on carousel 18. When the processing has been completed, for the wafers mounted on carousel 18, the gate valve upstream of tube 34 is closed to seal chamber 14 from the remainder of the system and chamber 14 is vented to the atmosphere. Thereafter, lid 12.1 is opened, the processed wafers removed, and chamber 14 is reloaded so that additional wafers may be processed.

In the subject invention, assuming chamber 14 to have about the same 22 inch diameter but by having it conform closely to the configuration of the carousel one would reduce the volume of chamber 14 to about 768 in$^3$. Thus, by choosing an end processing chamber having a configuration that closely conforms to the contour of carousel 18 (which displaces about 240 in$^3$), the total volume to be pumped down by diffusion pump 36 has been reduced to about 528 in$^3$. Thus, the ratio of the volume of chamber 14 to the volume displaced by carousel 18 is of the order of about 3:1. My novel end processing chamber would then only require a pump down time of about 55 seconds to achieve a vacuum of about $5 \times 10^{-6}$ torr and, upon the completion of the 4 minute processing time, will only require about 10 seconds to exhaust. Assuming that both the prior art and my invention utilize carousels that will hold about twenty " wafers, it will be seen that I am able to process 20 wafers in about 5 minutes or about 240 wafers an hour. Utilizing the same processing time and the same number of wafers of the same size arranged around the prior art back-to-back carousels, it will be seen that with a 27 minute processing time, the prior art is only able to process about 80 wafers in a little under an hour (54 minutes). Thus, I am able to achieve an output that almost triples the output of the prior art.

Further, and referring again to FIG. 2, it will be seen that with my system I have provided a lighter and more compact end processing station 10. In addition, other advantages reside therein. For example, it is a common practice to mount the wafers to be processed at an angle of about 7° with respect to the incoming ion beam. However, in many instances, it has been found advantageous to vary this angle as much as 1° or 2° when different substrates and different dopant atoms are being utilized. The prior art end processing stations provide no such means in a system designed for use in a production line. In my system, carousel 18 is provided with holding means 18.1 arranged at right angles to the plane of the carousel. To achieve the 7° angle or any variation (7°±2°), I have provided my light weight housing with a means for varying this angle. This may take the form of a pivot point 40 mounted at one end of housing 12 and a screw jack arrangement 38 mounted 180° from pivot 40. In this manner housing 12 may be slightly angularly displaced to achieve any desired angle.

Thus, there is described a novel end processing chamber for an ion implanting system wherein by contouring the chamber to closely follow the outline of the carousel, I am able to almost triple the production rate of implanted wafers and with this configuration I am more easily able to vary the angle at which the wafers are implanted to achieve better results.

What I claim is:

1. In an ion implantation system having an evacuation hamber and a carousel, the carousel having provisions for supporting a plurality of substrates around its periphery and rotatably mounted within the chamber to sequentially expose the substrates to a beam of ions to be implanted in the substrate, the substrates supported around the periphery of the carousel substantially perpendicular to the plane of rotation of the carousel, the improvement in the evacuation chamber comprising:

the inner contour of the chamber configured to closely follow both the contour of the carousel and the contour of the perpendicularly disposed substrates; and the ratio of the volume of the chamber to the volumetric displacement of the carousel within the chamber being of the order of about 3:1.

2. In the system of claim 1 wherein:

the plane of rotation of the carousel is disposed at an angle of about 7° with respect to the beam of ions.

3. The ion implantation system of claim 2, further comprising means for varying the angle at which the beam of ions impinge on the substrate.

4. The ion implantation system of claim 3, wherein the means for varying the angle of the beam of ions comprises:

a screw jack affixed to the under portion of the evacuation chamber at a point diametrically opposed to the point of which the beam enters the chamber.

* * * * *

UNITED STATES PATENT AND TRADEMARK OFFICE
CERTIFICATE OF CORRECTION

PATENT NO. : 4,405,864

DATED : September 20, 1983

INVENTOR(S) : Eddy Humberto del Rio

It is certified that error appears in the above-identified patent and that said Letters Patent is hereby corrected as shown below:

```
Column 3, line 23, cancel "[4276-(2x106)" and instead
         insert --[4276-(2x106)]--.

Column 4, line 23, change 'twenty" wafers' and instead
         insert --twenty 4" wafers--.

Claim 1, line 2, "hamber" should be --chamber--.
```

Signed and Sealed this

Sixth Day of December 1983

[SEAL]

Attest:

GERALD J. MOSSINGHOFF

Attesting Officer    Commissioner of Patents and Trademarks